United States Patent
Chang et al.

(10) Patent No.: US 7,920,411 B2
(45) Date of Patent: Apr. 5, 2011

(54) CONVERTING SRAM CELLS TO ROM CELLS

(75) Inventors: Ingming Chang, San Jose, CA (US); Karl Lin Wang, Los Altos, CA (US)

(73) Assignee: ARM Limited, Cambridge (GB)

( * ) Notice: Subject to any disclaimer, the term of this patent is extended or adjusted under 35 U.S.C. 154(b) by 107 days.

(21) Appl. No.: 12/379,616

(22) Filed: Feb. 25, 2009

(65) Prior Publication Data

US 2010/0214824 A1 Aug. 26, 2010

(51) Int. Cl.
*G11C 11/40* (2006.01)

(52) U.S. Cl. .................. 365/156; 365/154; 365/104

(58) Field of Classification Search ............ 365/94, 365/104

See application file for complete search history.

(56) References Cited

U.S. PATENT DOCUMENTS

| | | | | |
|---|---|---|---|---|
| 4,132,904 A * | 1/1979 | Harari | ...................... | 365/185.07 |
| 4,403,306 A * | 9/1983 | Tokushige et al. | ............. | 365/156 |
| 5,040,143 A * | 8/1991 | Matsumura et al. | ............ | 365/51 |
| 5,455,788 A * | 10/1995 | Clark | .............. | 365/156 |
| 5,923,582 A * | 7/1999 | Voss | .............. | 365/154 |
| 6,041,008 A * | 3/2000 | Marr | .............. | 365/154 |
| 6,768,669 B2 * | 7/2004 | Schmidt et al. | ............... | 365/154 |

* cited by examiner

*Primary Examiner* — Tan T. Nguyen
(74) *Attorney, Agent, or Firm* — Nixon & Vanderhye P.C.

(57) ABSTRACT

A method of converting a static random access memory cell to a read only memory cell and the cell thus converted is disclosed. The cell to be converted comprises a data retention portion powered by a higher and lower voltage supply line and four transistors arranged as two cross coupled inverters. It is converted to a read only memory cell by severing a connection between at least one of said transistors within a first of said two inverters and one of said voltage supply lines such that when powered said first inverter outputs a predetermined value.

16 Claims, 7 Drawing Sheets

Via Programmed SRAM Cell with 0 Data

CONVERTING SRAM CELLS TO ROM CELLS

BACKGROUND OF THE INVENTION

1. Field of the Invention

The field of the invention relates to data storage cells for storing data.

2. Description of the Prior Art

There are many different types of data storage devices. There are ROM or read only memory cells which cannot be overwritten and are therefore used to store data permanently. There are also RAM or random access memory cells which can be overwritten and are therefore used to store data that can be changed.

Data storage is an important field and there are different types of both ROMs and RAMs. One common type of RAM is Static random access memory (SRAM). SRAM cells are a type of semiconductor memory which can be written to or read from in any order, regardless of the memory location that was last accessed and which use bistable latching circuitry so that they retain their data without the need to be periodically refreshed provided that they are powered.

FIG. 1 is a diagram illustrating an example construction of a 6T SRAM memory cell that may be used in an SRAM memory. As can be seen, the memory cell consists of two PMOS transistors 100, 110 and two NMOS transistors 120, 130. A node 140 is provided between the PMOS transistor 100 and the NMOS transistor 120, and similarly a node 150 is provided between the PMOS transistor 110 and the NMOS transistor 130. The inverted bit line BLN 180 is connected to the node 140 via an access transistor 160, and similarly the bit line BL 190 is connected to the node 150 via an access transistor 170.

The two sets of transistors 100, 110, 120 and 130 act as cross coupled inverters and thus, the device is a bistable device with two states that can be switched between. These two different states are a first state where the node 140 is at a ground potential and the node 150 is at a power supply potential $V_{DD}$, and a second state where the node 140 is at the power supply potential $V_{DD}$ and the node 150 is at the ground potential.

In some circumstances it may be desirable to use RAM for storing programming code, for example while the code is being developed, but then once a desired form of code has been found then it may be more appropriate to store it in ROM so that it does not need to be reloaded into memory after power on. A disadvantage of changing the type of memory cell storing the code is that if the system has been developed using SRAM memory cells for storing the programming code, then replacing the SRAM with ROM will need a substantial redesign of the system. This redesign may mean that any previous testing and verification of the system may need to be redone.

SUMMARY OF THE INVENTION

A first aspect of the present invention provides a method of converting a static random access memory cell comprising a data retention portion powered by a higher and lower voltage supply line and comprising four transistors arranged as two cross coupled inverters to a read only memory cell said method comprising: severing a connection between at least one of said transistors within a first of said two inverters and one of said voltage supply lines such that when powered said first inverter outputs a predetermined value.

Static random access memory cells are convenient ways of storing data in that they can be overwritten to store new data but do not need to be continuously refreshed. For this reason they are a very popular form of storage. There are however certain circumstances where it is desirable to store data in a permanent form that cannot be overwritten and for these purposes read only memory ROM cells are used. These cells are clearly not as flexible as SRAM cells and are designed and built in a different way and thus, have different topology and also different performance characteristics. The present invention recognises that although ROM cells generally have a smaller footprint than SRAM cells in some circumstances it may be desirable to provide ROM cells in the same format as SRAM cells. It also recognises that a potential way of doing this is by providing a method of converting a SRAM cell to a ROM cell by severing connections between the voltage supply lines and at least one of the transistors within a first of the two inverters. In this simple way a SRAM cell is converted into a ROM cell, the ROM cell having the same topology and characteristics as the SRAM cell.

A further advantage of providing a ROM cell by converting an SRAM cell is that in some situations it might be desirable to have a system formed from SRAM cells initially and later it may be desirable for the cells to hold permanent values. In such circumstances, being able to convert SRAM cells to ROM cells would be advantageous. For example, an SRAM cell could be used during the design of a system and once the desired code is identified then the code could be permanently programmed into the cells by converting the SRAM cells to the appropriate ROM cells. As the footprint and performance characteristics of these converted cells are the same as the SRAM, the actual design of the system would not have changed and thus, its testing verification will hold valid.

It should be noted that the severing of a single connection in this way is a very simple and straightforward way of converting the cells.

In some embodiments, said method comprises a further step of severing a connection between a further transistor within a second of said two inverters and another of said voltage supply lines such that when powered said second inverter outputs a different predetermined value to said first inverter.

In order for the cells to more reliably store a predetermined value, it may be preferable to sever connections in both of the two inverters, this will produce a more stable storage cell.

In some embodiments, said step of severing said connection comprises removing a via connecting said voltage supply line to said transistor.

One simple way of severing the connection is by removing a via connecting the voltage line to the transistor. This is a simple way of converting the cell that requires only one mask layer change when manufacturing the device. It should be noted that in this respect there is no re-design necessary other than the via layer change to convert an SRAM to a ROM with equal performance and footprint. The only disadvantage is that this results in a ROM cell that is larger in area than a conventional ROM cell.

In other embodiments, said step of severing said connection comprises severing a metallisation layer connecting said voltage supply line to said transistor.

An alternative way of severing the connection to the voltage supply line is by severing a metalisation layer.

In some embodiments, said static random access memory cell further comprises two access transistors having different threshold voltages linking said data retention portion to respective bit lines, said static random access memory being a single ended sensing memory cell, said method comprising a further step of severing a connection between an output of said access transistor having a higher threshold voltage and one of said bit lines, said one of said bit lines being a bit line held at a predetermined voltage.

The technique is also applicable to a single ended sensing memory cell, although in this case an additional connection should be severed to convert the cell into a ROM.

A further aspect of the present invention provides a data storage cell comprising supply voltage lines connectable to a higher voltage source and a lower voltage source for powering said data storage cell, said data storage cell comprising: a data retention portion; said data retention portion comprising four transistors arranged as two cross coupled inverters, such that when powered a higher or lower voltage value is output from a first of said two inverters and the other lower or higher voltage value is output by a second of said two inverters, wherein said first inverter is arranged to be powered by only one of said two voltage sources, such that when said data storage cell is powered said first inverter outputs a predetermined one of said higher or lower voltage value dependent upon said voltage source powering said first inverter.

The present invention provides a read only memory cell that has the same footprint and performance characteristics as a static random access memory cell. It is designed in a similar way to the static random access memory cell with some of the connections that are usually present in such a cell not being present. The advantage of such a device is such that although it is larger than a conventional ROM and therefore there may be a technical prejudice against using it, it can be used in designs that have been tested using SRAMs without the need to redesign or retest the device and it could also be used in an SRAM memory where it is desirable that some of the cells store permanent values. For example it is desirable for power on reset to occur automatically without an external reset pin in an SRAM memory product design. In a design where the reset of the internal clock is controlled by the data programmed into a group of SRAM cells it would be desirable to replace these with storage cells that store permanent values and in this way a reliable yet simple method of bit cell programming is provided.

In some embodiments, said second inverter is arranged to be powered by only one of said two voltage sources, said first and second inverters being powered by different voltage sources such that when powered said first and second inverters respectively each output a different one of said higher and said lower voltage value.

By suitable arrangement of which inverter is powered a desired predetermined data value can be stored whenever the device is powered.

In some embodiments, said data storage cell further comprises two output nodes for outputting data and two access transistors each responsive to a control signal to connect said two outputs of said two inverters to said two output nodes.

In some embodiments, each of said two inverters comprises a pmos transistor stacked on an nmos transistor; a first of said two inverters having a source of said pmos transistor connected to said higher voltage supply line and a drain of said nmos transistor floating, such that when powered said inverter outputs a higher voltage value from a node between said stacked transistors; and a second of said two inverters having a source of said pmos transistor floating and a drain of said nmos transistor connected to said lower voltage supply line, such that when powered said inverter outputs a lower voltage value from a node between said stacked transistors.

In some embodiments and said data storage cell further comprises an output node for outputting data from said data storage cell and two access transistors, a first access transistor being responsive to a control signal to connect an output of a first of said two inverters to said output node, and a second access transistor having a higher threshold voltage than said first access transistor and being connected to an output of said second inverter.

In some embodiments, each of said two inverters comprises a pmos transistor stacked on an nmos transistor; a first of said two inverters having a source of said pmos transistor floating and a drain of said nmos transistor connected to said lower voltage source, such that said first inverter outputs said lower voltage value from a node between said stacked transistors via said first access transistor to an output node; and said second access transistor being arranged to link said output of said second inverter to a line tied to said higher voltage supply line.

In some embodiments, said second access transistor has a floating output such that said output of said second inverter is not connected to an output line; wherein each of said two inverters comprise a pmos transistor stacked on an nmos transistor; a first of said two inverters having a source of said pmos transistor connected to said higher voltage source and a drain of said nmos transistor connected to said lower voltage level, such that said inverter outputs said higher voltage value from a node between said stacked transistors via said first access transistor to an output node; and a second of said two inverters having a source of said pmos transistor floating and a drain of said nmos transistor connected to said lower voltage source, such that said inverter comprises said lower voltage value at a node between said stacked transistors.

It may be advantageous for the access transistors to be NMOS transistors in other embodiments PMOS transistors may be preferable.

In some embodiments, said data storage cell is compatible with a static random access memory cell and occupies a same area as said static random access memory cell.

The design of the storage cell of embodiments of the present invention is such that it may have the same footprint and performance characteristics as an SRAM cell and as such can be used alongside these where it is desirable for a certain value to be permanently stored in a cell that is compatible with SRAM cells.

A third aspect of the present invention provides a memory comprising a plurality of data storage cells according to a second aspect of the present invention said plurality of data storage cells being arranged in an array, said memory further comprising: at least one bit line associated with each column of said array; and at least one word line associated with each row of said array; wherein an output of a first inverter of each of said memory cells in a column is in data communication with a respective bit line via a respective access transistor, said respective access transistors communicating said outputs of said first inverters to said bit line in response to a control value received at a gate of said access transistor, said control value being sent via said at least one word line to all access transistors in a row of said array.

Data storage cells of embodiments of the present invention can be arranged in an array to form a memory.

In some embodiments said plurality of data storage cells comprising at least some SRAM cells.

The memory may be formed of conventional SRAM cells and ROM cells according to an embodiment of the invention. These ROM cells have the same characteristics and footprint as conventional SRAM cells and thus, can be used in a memory array alongside them where it is advantageous to have some cells permanently storing values, and some cells that can be written to.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2b shows a layout diagram of the cell of FIG. 2a;

FIG. 3b shows a layout diagram of the cell of FIG. 3a;

FIG. 5b shows a layout diagram of the cell of FIG. 5a;

DESCRIPTION OF THE PREFERRED EMBODIMENTS

Figure 1:
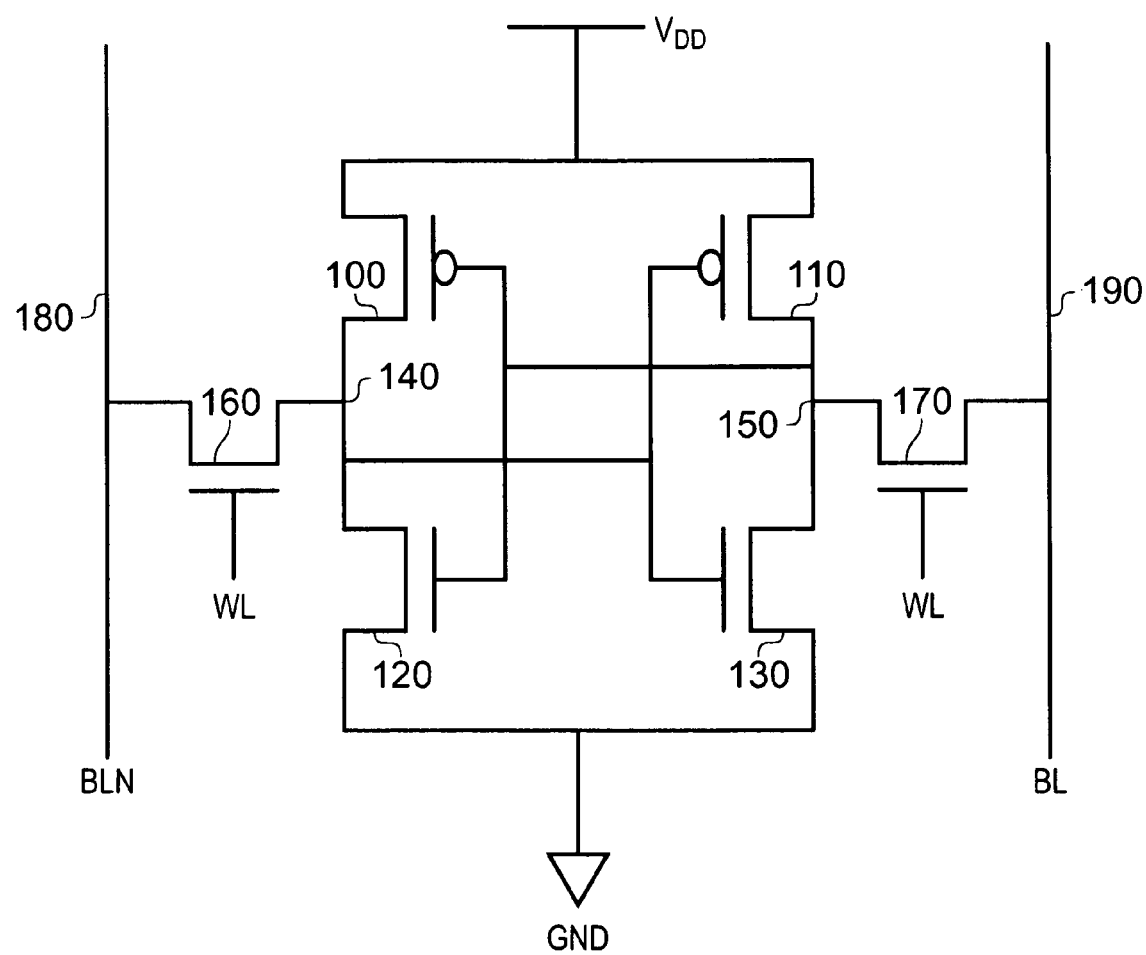
FIG. 1 shows a 6T SRAM memory cell according to the prior art.
Figure 2A:
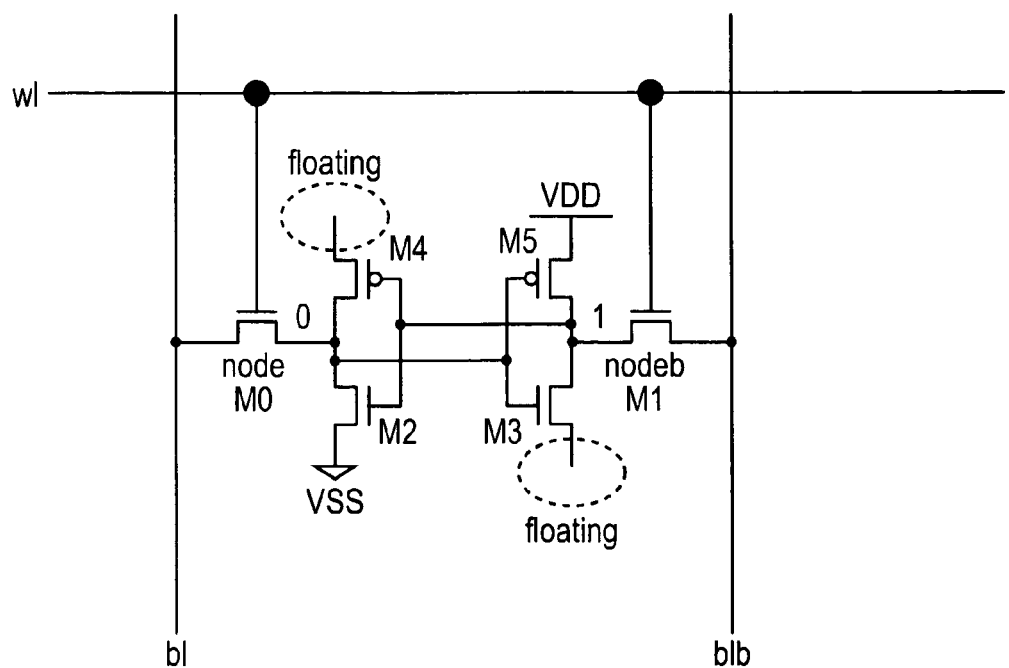
FIG. 2a schematically shows a memory cell via programmed with data 0 for dual-ended sensing according to an embodiment of the invention.

FIG. 2a shows a conventional SRAM 6T cell that has been via programmed to convert it to a cell that when powered always stores a 0. Thus, in effect it has been converted to a read-only memory ROM cell. This has been done by removing the vias that were previously present connecting the source of PMOS transistor M4 to the high voltage line VDD and the drain of NMOS transistor M3 to the low voltage line VSS. This means that the high voltage line VDD has nowhere to drain to and thus, node b is held at a 1, and meanwhile there is no power to transistor M4 and thus node is held at a 0. Thus, this device is very similar to the conventional SRAM cell shown in FIG. 1 except that the vias have been removed that would have connected the transistors M4 and M3 to respectively the high and lower voltage supplies. Thus, rather than being a bistable device that can switch between two stable states it is now held in one of those stable states. The state it is held in is a state where a zero is output on bit line BL and a one on inverse bit line BLB, whenever the word line sends a control signal indicating that a value should be output.

Figure 2B:
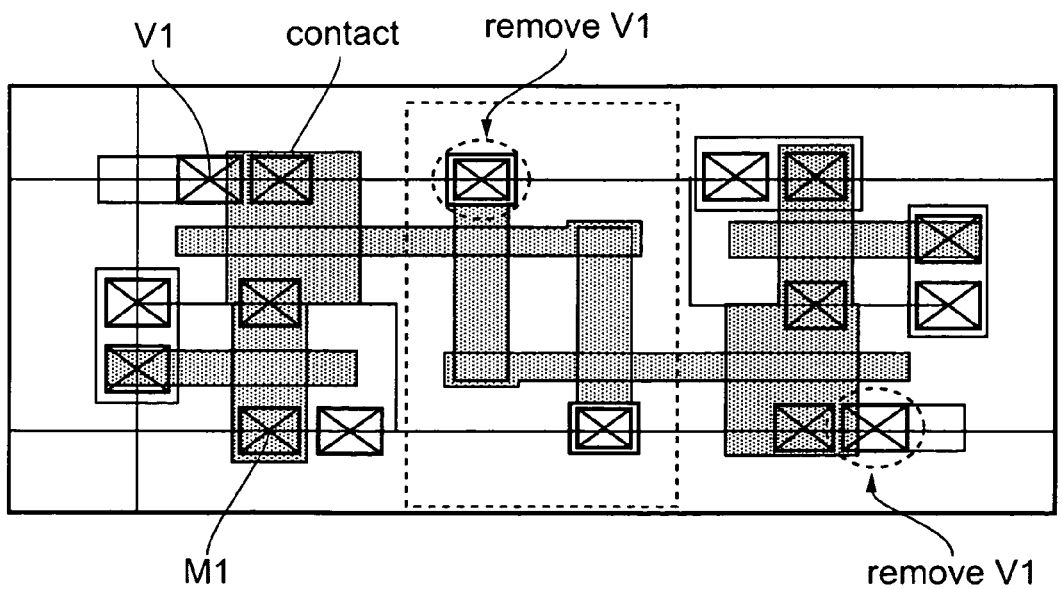

FIG. 2b shows the layout of this device where it is shown that vias have been removed. In this figure the "remove v1" squares denote vias that are removed from this location. Before removing the v1 via, the contact square served as the connection path to the source of the transistor. However, when v1 is removed the contact is intentionally left floating. The concept of the programming in this embodiment is done through a single v1 layer.

Figure 3A:
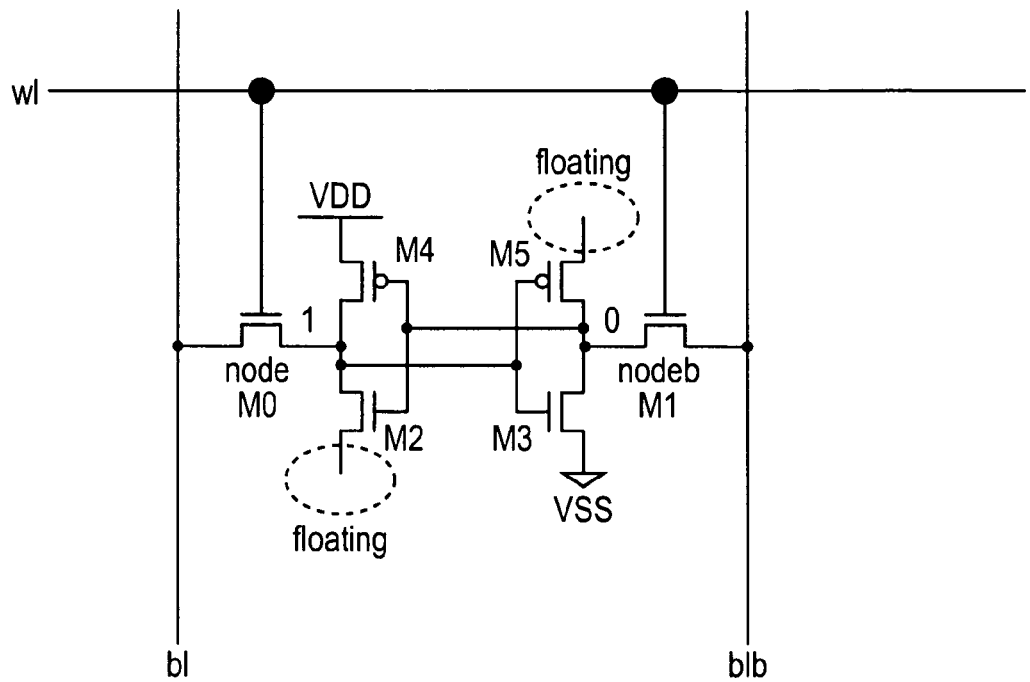
FIG. 3a schematically shows a memory cell via programmed with data 1 for dual-ended sensing according to an embodiment of the invention.

FIG. 3a shows a conventional six transistor SRAM cell that has been via programmed to permanently store a one. In this embodiment, the connection of NMOS transistor M2 to VSS and of PMOS transistor M5 to VDD have been severed so that these two terminals are floating. This means that a one is held permanently at the node that is connected via access transistor M0 to the bit line and a zero is held permanently at node b which is connected via transistor M1 to the inverse bit line BLB.

Figure 3B:
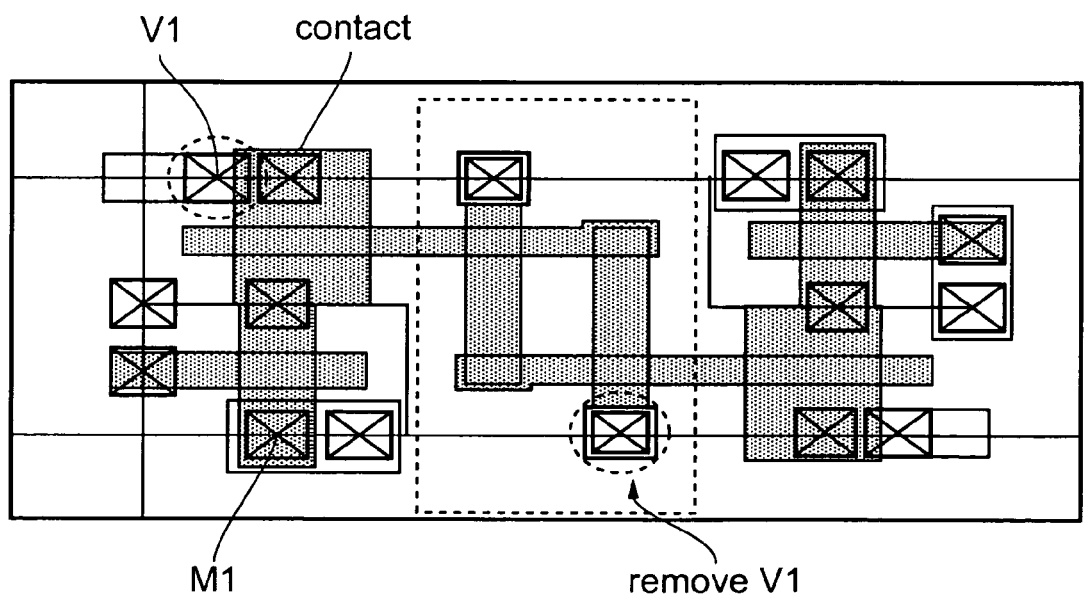

FIG. 3b shows the layout version of this arrangement. Once again the "remove v1" shows where a via is removed, and the contact square is a contact that is left floating after the removal of the via.

It should be noted that although in these two embodiments each of the two cross coupled inverters have had a connection to their power line severed in order to hold them in a particular state, in some embodiments it may be that just one of the terminals is floating and the other is connected. It would be sufficient to sever just one terminal as this would hold one of the inverters in a stable state which would force the bistable device to retain this state. However, having two floating terminals makes the device more reliable.

Figure 4:
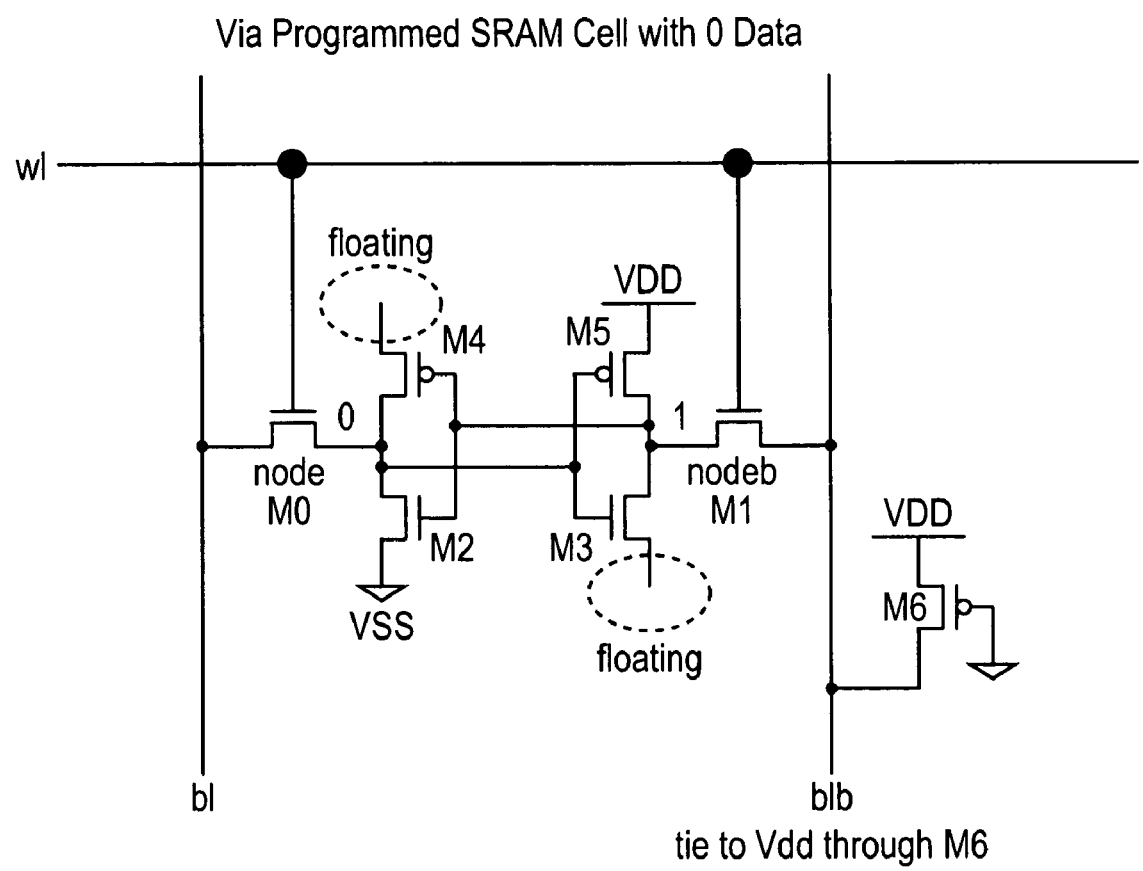
FIG. 4 schematically shows a memory cell via programmed with data 0 for single-ended sensing according to an embodiment of the invention.

FIG. 4 shows a traditional SRAM that is used for single ended sensing whereby the data is output by the bit line and the inverse bit line is held at a fixed value that has been converted to a ROM according to an embodiment of the present invention. In this example similar to the example of FIG. 2a, the connections to the VDD for PMOS transistor M4 and VSS for NMOS transistor M3 have been severed, so that when powered it stores a 0. This may be done in many different ways. For example the vias that connect them could be removed or metallisation layers could be severed.

Figure 5A:
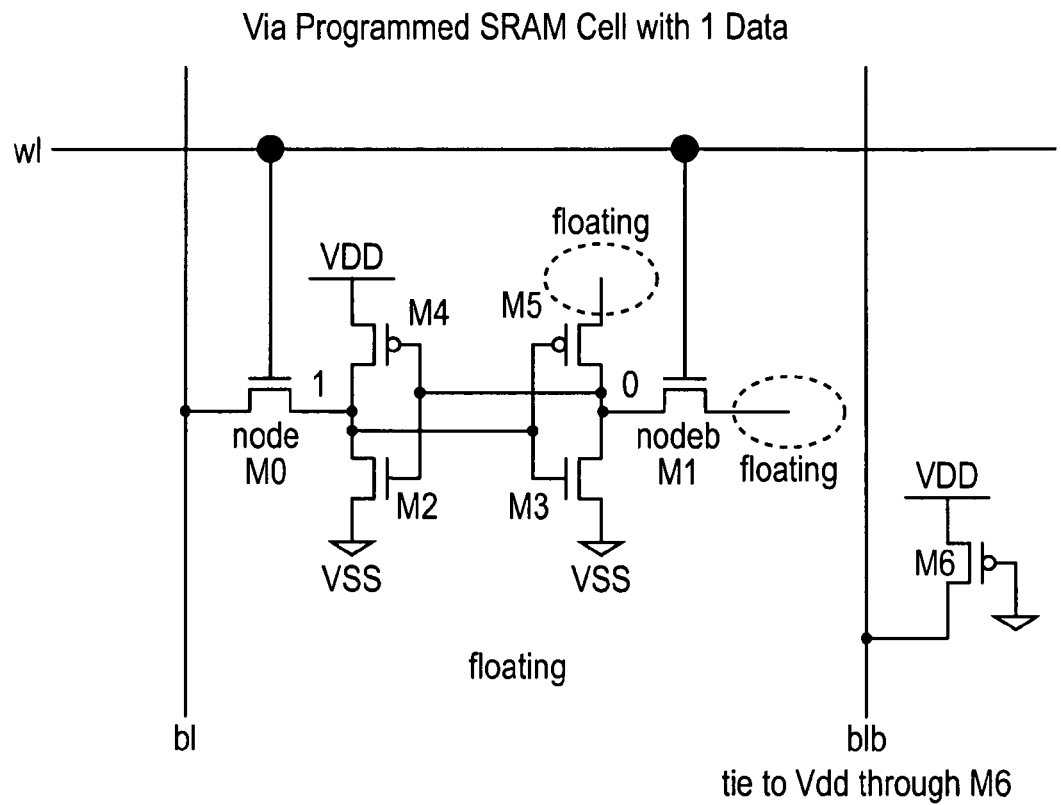
FIG. 5a schematically shows a memory cell via programmed with data 1 for single-ended sensing according to an embodiment of the invention.

FIG. 5a shows a memory cell for single ended sensing via programmed with a one. This is a traditional single ended sensing SRAM cell whereby the output is output via bit line BL. In this case, the connection between the access transistor M1 and the inverse bit line which is tied to VDD has been severed. Similarly the connection between the PMOS transistor M5 of the second inverter and the positive voltage VDD has been severed so that this is floating. This ties the node b to 0 and therefore the node to 1. Thus, this SRAM cell is tied to output a one.

Figure 5B:
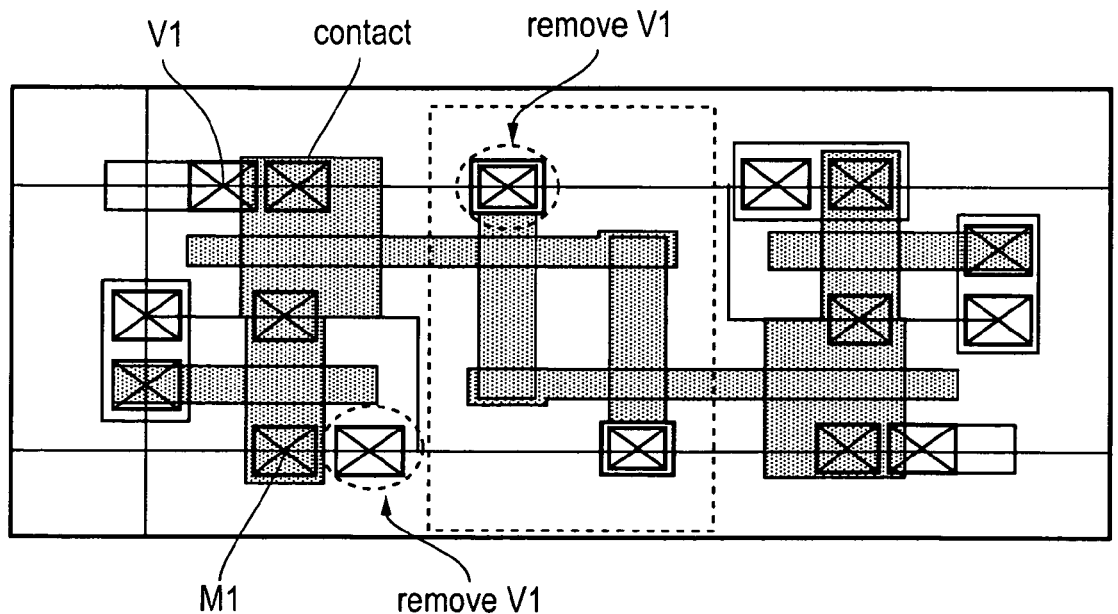

A layout diagram of this is shown in FIG. 5b. Once again the "remove v1" shows where a via is removed, and the contact square is a contact that is left floating after the removal of the via.

Figure 6:
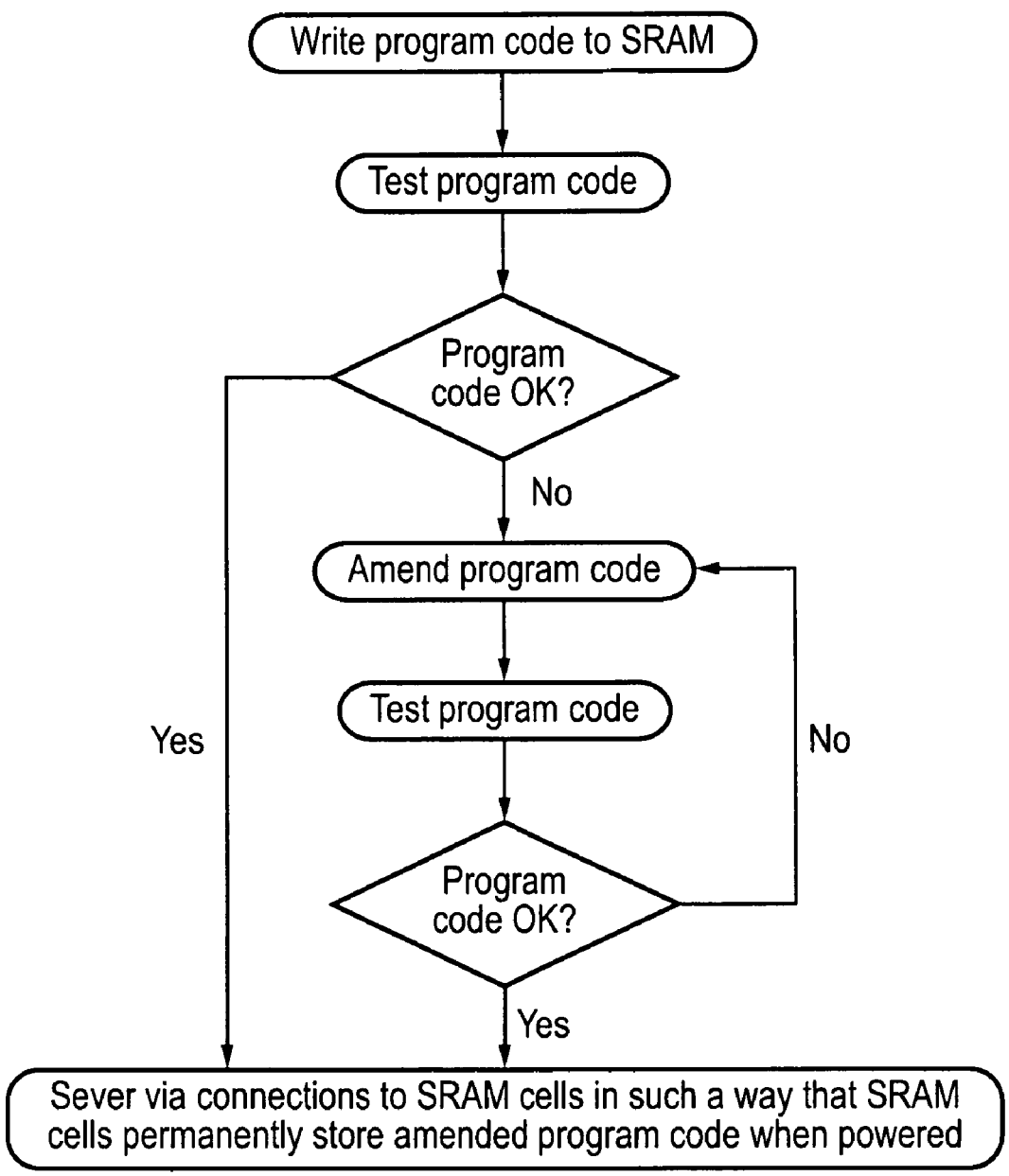
FIG. 6 shows a flow diagram of a method of converting a SRAM to a ROM cell according to an embodiment of the invention.

FIG. 6 shows a flow diagram illustrating methods in a step according to an embodiment of the invention. This method is a method of developing program code for a data processing system. This data processing system has SRAM memory for storing the program code that is being developed. Thus, program code is loaded on to the SRAM memory on start-up and it is amended and tested as required. When a final version of the code has been decided on, then this code is programmed into the SRAM by removing vias from each SRAM cells so that they store the required value. In this way, the code is loaded permanently onto the system on power up. This means that it does not have to be loaded onto a system each time the system is powered on as would be the case if conventional SRAM was used to store the code.

Figure 7:
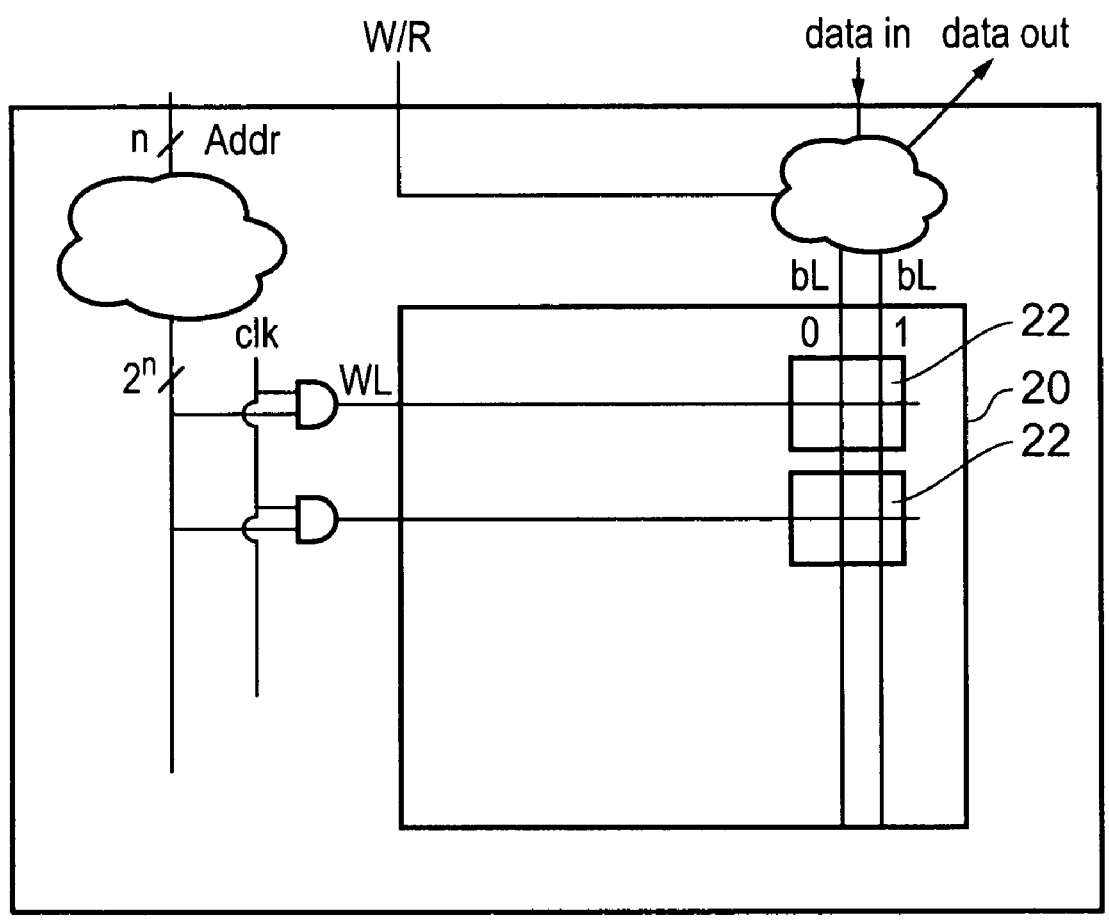
FIG. 7 shows an array of memory cells according to an embodiment of the present invention.

FIG. 7 shows in schematic form memory array having a plurality of cells 22 which are the cells of FIG. 2a or 3a via programmed to store either a 0 or a 1. Thus, as can be seen this memory array looks like a conventional SRAM memory array but is in fact operating as a ROM with each of the cells being programmed to store a particular value. Thus, on power up it is known what this memory will store. However, each of the cells in the memory has the same footprint and the same connections as a conventional SRAM cell and thus, the memory device has the same footprint and connections. This means that any verification that may have been done for a SRAM memory will work with this memory although it is now a ROM. Thus, a ROM function has been obtained at the same performance as a SRAM without a redesign. Furthermore, an actual ROM is usually slower than this device although it will take up less space.

In alternative embodiments some of the memory cells 22 would be ROM cells such as those shown in FIG. 2a or 3a and some conventional SRAM cells. In such a way a memory array is produced that has a section that permanently stores some values and a section that can be overwritten. This may be useful in some circumstances such as to allow power on reset to occur automatically without an external reset pin. During such power on reset the internal clock must be able to service itself reliably and this can be done by providing the appropriate values in certain of the SRAM cells as soon as the SRAM is powered, by converting some of the cells to the appropriate ROM cells.

It should be noted that although the figures shown illustrate conventional 6T SRAM cells it would be clear to a skilled person that other SRAM cells could also be programmed in this way.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A method of converting a static random access memory cell comprising a data retention portion powered by a higher and lower voltage supply line and comprising four transistors arranged as two cross coupled inverters to a read only memory cell said method comprising:
    severing a connection between at least one of said transistors within a first of said two inverters and one of said voltage supply lines such that when powered said first inverter outputs a predetermined value, and
    severing a connection between a further transistor within a second of said two inverters and another of said voltage supply lines such that when powered said second inverter outputs a different predetermined value to said first inverter.

2. A method according to claim 1, wherein said step of severing said connection comprises removing a via connecting said voltage supply line to said transistor.

3. A method according to claim 1, wherein said step of severing said connection comprises severing a metallisation layer connecting said voltage supply line to said transistor.

4. A method of converting a static random access memory cell comprising a data retention portion powered by a higher and lower voltage supply line and comprising four transistors arranged as two cross coupled inverters to a read only memory cell said method comprising:
    severing a connection between at least one of said transistors within a first of said two inverters and one of said voltage supply lines such that when powered said first inverter outputs a predetermined value, wherein said static random access memory cell further comprises two access transistors having different threshold voltages linking said data retention portion to respective bit lines, said static random access memory being a single ended sensing memory cell, and
    severing a connection between an output of said access transistor having a higher threshold voltage and one of said bit lines, said one of said bit lines being a bit line held at a predetermined voltage.

5. A data storage cell comprising supply voltage lines connectable to a higher voltage source and a lower voltage source for powering said data storage cell, said data storage cell comprising:
    a data retention portion;
    said data retention portion comprising four transistors arranged as two cross coupled inverters, such that when powered a higher or lower voltage value is output from a first of said two inverters and the other lower or higher voltage value is output by a second of said two inverters, wherein said first inverter is arranged to be powered by only one of said two voltage sources, such that when said data storage cell is powered said first inverter outputs a predetermined one of said higher or lower voltage value dependent upon said voltage source powering said first inverter.

6. A data storage cell according to claim 5, wherein said second inverter is arranged to be powered by only one of said two voltage sources, said first and second inverters being powered by different voltage sources such that when powered said first and second inverters respectively each output a different one of said higher and said lower voltage value.

7. A data storage cell according to claim 5, said data storage cell further comprising two output nodes for outputting data and two access transistors each responsive to a control signal to connect said two outputs of said two inverters to said two output nodes.

8. A data storage cell according to claim 7, wherein said access transistors comprise nmos transistors.

9. A data storage cell according to claim 5, wherein each of said two inverters comprises a pmos transistor stacked on an nmos transistor;
    a first of said two inverters having a source of said pmos transistor connected to said higher voltage supply line and a drain of said nmos transistor floating, such that when powered said inverter outputs a higher voltage value from a node between said stacked transistors;
    and a second of said two inverters having a source of said pmos transistor floating and a drain of said nmos transistor connected to said lower voltage supply line, such that when powered said inverter outputs a lower voltage value from a node between said stacked transistors.

10. A data storage cell according to claim 5, said data storage cell further comprising an output node for outputting data from said data storage cell and two access transistors, a first access transistor being responsive to a control signal to connect an output of a first of said two inverters to said output node, and a second access transistor having a higher threshold voltage than said first access transistor and being connected to an output of said second inverter.

11. A data storage cell according to claim 10, wherein each of said two inverters comprises a pmos transistor stacked on an nmos transistor;
    a first of said two inverters having a source of said pmos transistor floating and a drain of said nmos transistor connected to said lower voltage source, such that said first inverter outputs said lower voltage value from a node between said stacked transistors via said first access transistor to an output node; and
    said second access transistor being arranged to link said output of said second inverter to a line tied to said higher voltage supply line.

12. A data storage cell according to claim 10, said second access transistor having a floating output such that said output of said second inverter is not connected to an output line;

wherein each of said two inverters comprise a pmos transistor stacked on an nmos transistor;

a first of said two inverters having a source of said pmos transistor connected to said higher voltage source and a drain of said nmos transistor connected to said lower voltage level, such that said inverter outputs said higher voltage value from a node between said stacked transistors via said first access transistor to an output node;

and a second of said two inverters having a source of said pmos transistor floating and a drain of said nmos transistor connected to said lower voltage source, such that said inverter comprises said lower voltage value at a node between said stacked transistors.

13. A data storage cell according to claim 10, wherein said access transistors comprise nmos transistors.

14. A data storage cell according to claim 5, wherein said data storage cell is compatible with a static random access memory cell and occupies a same area as said static random access memory cell.

15. A memory comprising a plurality of data storage cells arranged in an array, at least some of said data storage cells comprising data storage cells according to claim 5, said memory further comprising:

at least one bit line associated with each column of said array; and at least one word line associated with each row of said array; wherein an output of a first inverter of each of said memory cells in a column is in data communication with a respective bit line via a respective access transistor, said respective access transistors communicating said outputs of said first inverters to said bit line in response to a control value received at a gate of said access transistor, said control value being sent via said at least one word line to all access transistors in a row of said array.

16. A memory according to claim 15, said plurality of data storage cells comprising at least some SRAM cells.

* * * * *